US008418115B1

(12) United States Patent
Tom et al.

(10) Patent No.: US 8,418,115 B1
(45) Date of Patent: Apr. 9, 2013

(54) ROUTABILITY BASED PLACEMENT FOR MULTI-DIE INTEGRATED CIRCUITS

(75) Inventors: Marvin Tom, Mt. View, CA (US); Rajat Aggarwal, Los Altos, CA (US); Srinivasan Dasasathyan, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 196 days.

(21) Appl. No.: 12/777,991

(22) Filed: May 11, 2010

(51) Int. Cl.
*G06F 17/5077* (2006.01)

(52) U.S. Cl.
USPC .......... 716/131; 716/105; 716/124; 716/125; 716/126

(58) Field of Classification Search .................... 716/131
See application file for complete search history.

(56) References Cited

U.S. PATENT DOCUMENTS

| | | | |
|---|---|---|---|
| 2002/0176238 A1* | 11/2002 | Crane et al. | 361/772 |
| 2004/0098694 A1* | 5/2004 | Teig et al. | 716/13 |
| 2005/0127490 A1* | 6/2005 | Black et al. | 257/686 |
| 2010/0271071 A1* | 10/2010 | Bartley et al. | 326/101 |
| 2011/0055791 A1* | 3/2011 | Gao | 716/131 |

OTHER PUBLICATIONS

Karypis, George et al., "Multilevel Hypergraph Partitioning: Applications in VLSI Domain," *IEEE Transactions on Very Large Scale Integration (VLSI) Systems*, Mar. 1999, pp. 69-79, vol. 7, No. 1, IEEE, Piscataway, New Jersey, USA.

* cited by examiner

*Primary Examiner* — Paul Dinh
*Assistant Examiner* — Bryce Aisaka
(74) *Attorney, Agent, or Firm* — Kevin T. Cuenot; LeRoy D. Maunu

(57) ABSTRACT

A method of component placement for a multi-die integrated circuit (IC) can include partitioning a plurality of components of a netlist among a plurality of dies of the multi-die IC and selecting a superimposition model specifying a positioning of at least two of the plurality of dies at least partially superimposed with respect to one another. The method also can include assigning, by a processor, components of the netlist to hardware units within each of the plurality of dies according, at least in part, to a wire-length metric calculated using the superimposition model.

20 Claims, 7 Drawing Sheets

ROUTABILITY BASED PLACEMENT FOR MULTI-DIE INTEGRATED CIRCUITS

FIELD OF THE INVENTION

The embodiments disclosed within this specification relate to integrated circuits (ICs). More particularly, the embodiments relate to routability based placement for multi-die ICs.

BACKGROUND

Programmable integrated circuits (ICs) are a well-known type of integrated circuit that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry, and the programmable logic circuitry, are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

In general, the probability that a manufacturing flaw or "fault" will occur within an IC increases as the size of the die used to implement that IC increases. The occurrence of a manufacturing fault within an IC can result in a reduction, or a complete failure, in the operability of the IC. For this reason, it can be more cost effective to divide the circuits to be implemented within the IC across multiple dies. In this manner, a manufacturing fault occurring on any one of the dies renders only that die inoperable and not the entire IC. By implementing the IC using multiple dies as opposed to a single larger die, less die area of the IC becomes unusable when a manufacturing fault renders one of the dies inoperable. Using a multi-die approach, ICs can be implemented with multiple dies placed within a single package.

Implementing an IC with multiple dies requires a partitioning of circuits of the IC among two or more dies. Partitioning circuits of the IC among dies results in one or more inter-die signals. These inter-die signals can be passed between two dies, for example, via inter-die wires that electrically couple the die pair. Thus, an IC can be implemented within a single package using multiple dies that communicate with one another via inter-die wires as described.

SUMMARY

The embodiments disclosed within this specification relate to integrated circuits (ICs) and, more particularly, to routability based placement for multi-die ICs. One embodiment can include a method of component placement for a multi-die IC. The method can include partitioning a plurality of components of a netlist among a plurality of dies of the multi-die IC and selecting a superimposition model specifying a positioning of at least two of the plurality of dies at least partially superimposed with respect to one another. The method further can include assigning, by a processor, components of the netlist to hardware units within each of the plurality of dies according, at least in part, to a wire-length metric calculated using the superimposition model.

Partitioning the plurality of components can include selecting a partitioning solution resulting in a minimum number of inter-die signals. Partitioning the plurality of components also can include, for each pair of dies coupled by at least one inter-die signal, determining whether a number of inter-die signals between the pair of dies exceeds a number of inter-die wires coupling the pair of dies. Partitioning the plurality of components further can include selecting an alternate partitioning of the plurality of components when the number of inter-die signals for at least one pair of dies exceeds a number of inter-die wires coupling the pair of dies.

The superimposition model can superimpose a first die of a pair of dies of the multi-die IC that are coupled by at least one inter-die wire atop a second die of the pair of dies within a common plane. The superimposition model further can reposition the pair of dies relative to one another with a connection point of the first die co-located with a connection point of the second die in the common plane, where the connection point of the first die couples to a first endpoint of the at least one inter-die wire and the connection point of the second die couples to a second endpoint of the at least one inter-die wire. For example, the superimposition model can shift at least one die of the pair of dies along at least one axis of a pair of axes defining the common plane.

In one aspect, assigning components of the netlist to hardware units can include, for each component of the netlist, determining whether at least one hardware unit is available within the die to which the component is partitioned and selecting a hardware unit to which the component is to be assigned resulting in a lowest wire-length metric using the superimposition model when at least one hardware unit is available within the die to which the component is partitioned.

In another aspect, assigning components of the netlist to hardware units further can include selecting a hardware unit in a different die according to the wire-length metric using the superimposition model when at least one hardware unit is not available within the die to which the component is partitioned.

Another embodiment can include a system that determines component placement for a multi-die IC. The system can include a memory storing program code and a processor coupled to the memory and executing the program code. The processor, responsive to executing the program code, can be configured to perform a plurality of operations. The plurality of operations can include partitioning a plurality of components of a netlist among a plurality of dies of the multi-die IC and selecting a superimposition model specifying a positioning of at least two of the plurality of dies at least partially superimposed with respect to one another. The operations further can include assigning, by a processor, components of the netlist to hardware units within each of the plurality of dies according, at least in part, to a wire-length metric calculated using the superimposition model.

The processor can be configured to select a partitioning solution resulting in a minimum number of inter-die signals. For each pair of dies coupled by at least one inter-die signal, the processor further can be configured to determine whether a number of inter-die signals between the pair of dies exceeds a number of inter-die wires coupling the pair of dies.

The superimposition model can superimpose a first die of a pair of dies of the multi-die IC that are coupled by at least one inter-die wire atop a second die of the pair of dies within a common plane. The superimposition model can reposition the pair of dies relative to one another with a connection point of the first die co-located with a connection point of the second die in the common plane, wherein the connection point of the first die couples to a first endpoint of the at least one inter-die wire and the connection point of the second die couples to a second endpoint of the at least one inter-die wire. For example, the superimposition model can shift at least one die of the pair of dies along at least one axis of a pair of axes defining the common plane.

Another embodiment can include a device including a non-transitory data storage medium usable by a system having a processor and a memory. The data storage medium can store program code that, when executed by the system, causes the system to execute operations. The operations can include partitioning a plurality of components of a netlist among a plurality of dies of the multi-die IC and selecting a superimposition model specifying a positioning of at least two of the plurality of dies at least partially superimposed with respect to one another. The operations can further include assigning components of the netlist to hardware units within each of the plurality of dies according, at least in part, to a wire-length metric calculated using the superimposition model.

Partitioning the plurality of components can include selecting a partitioning solution resulting in a minimum number of inter-die signals. Partitioning the plurality of components further can include, for each pair of dies coupled by at least one inter-die signal, determining whether a number of inter-die signals between the pair of dies exceeds a number of inter-die wires coupling the pair of dies.

The superimposition model can superimpose a first die of a pair of dies of the multi-die IC that are coupled by at least one inter-die wire atop a second die of the pair of dies within a common plane. The superposition model can reposition the pair of dies relative to one another with a connection point of the first die co-located with a connection point of the second die in the common plane, wherein the connection point of the first die couples to a first endpoint of the at least one inter-die wire and the connection point of the second die couples to a second endpoint of the at least one inter-die wire.

DETAILED DESCRIPTION

While the specification concludes with claims defining the features of the described embodiments that are regarded as novel, it is believed that the embodiments will be better understood from a consideration of the description in conjunction with the drawings. As required, detailed embodiments are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the embodiments disclosed within this specification.

The embodiments disclosed within this specification relate to multi-die integrated circuits (ICs) and, more particularly, to routability based component placement for multi-die ICs. In accordance with the embodiments disclosed within this specification, components of a netlist generated from a circuit design can be partitioned among a plurality of dies used to implement a multi-die IC. The netlist can be partitioned in a manner that minimizes the number of inter-die signals among the plurality of dies. A superimposition model can be generated that, in general, shifts the relative location of one or more dies coupled by inter-die wires. The location of the dies of each die pair, for example, can be shifted by approximately the length of the inter-die wires coupling the die pair. The superimposition model can provide a more accurate estimate of signal path distances that extend from one die to another.

After partitioning components to dies, a global placement location can be determined for each component of the netlist within the particular die to which that component is partitioned. A detailed placement location can be determined for each component of the netlist according, at least in part, to a wire-length metric that is calculated from the superimposition model. Use of the superimposition model results in a more accurate estimate of the actual wire-length of a given signal path and, in particular, inter-die signals. For example, detailed placement locations can be determined by attempting to minimize the wire-length metric on a per signal basis, on a per die basis, and/or across more than one or all dies of the multi-die IC.

Figure 1:
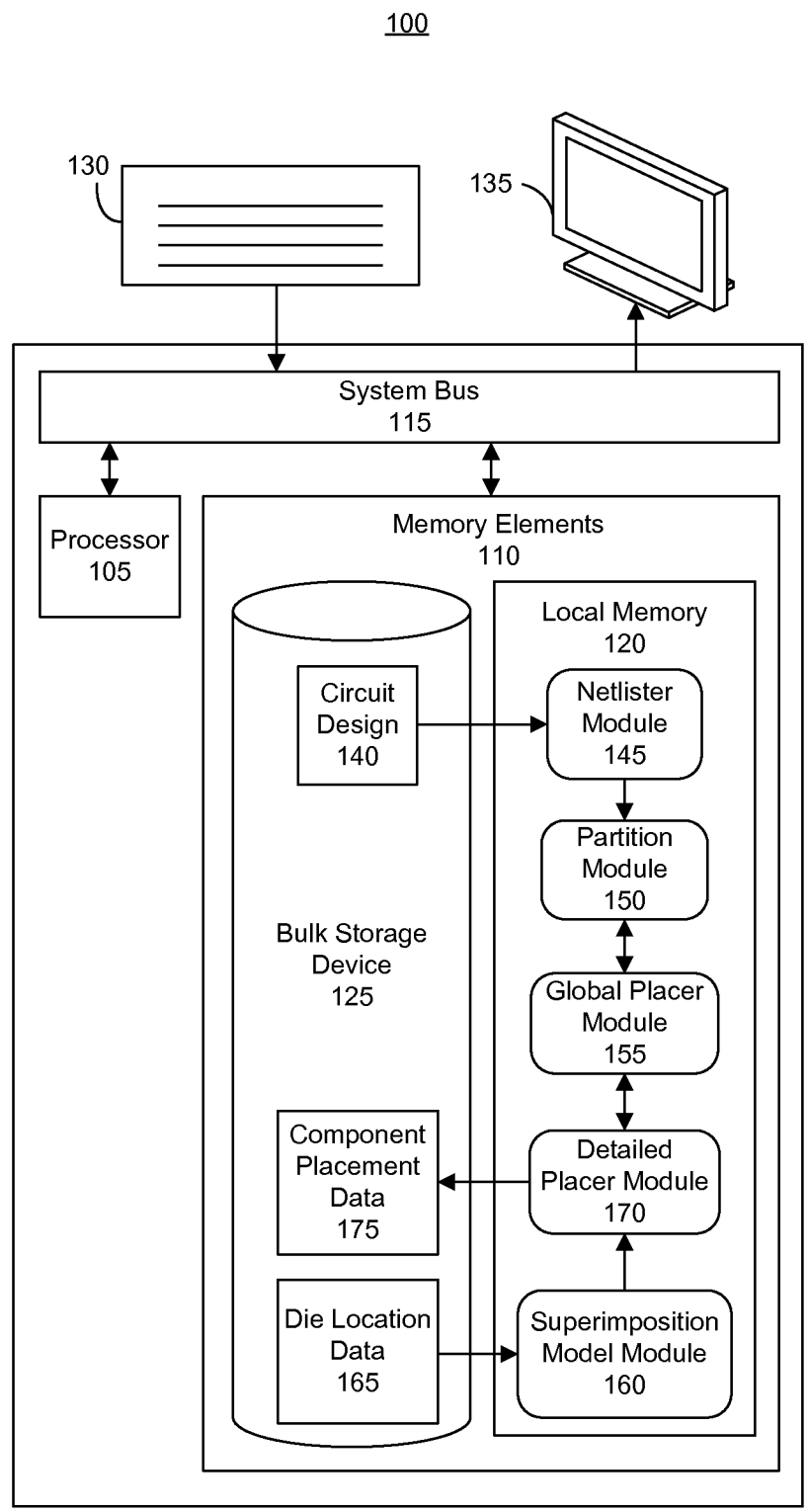
FIG. 1 is a first block diagram illustrating a component placement system for use with a multi-die integrated circuit (IC).

FIG. 1 is a first block diagram illustrating a component placement system for use with a multi-die IC. In one aspect, system 100 can generate one or more circuit designs for instantiation within a multi-die IC. It should be appreciated that the circuit designs generated by system 100 can be instantiated within a multi-die IC, whether that multi-die IC is programmable or not.

System 100 can include at least one processor 105 coupled to memory elements 110 through a system bus 115. As such, system 100 can store program code within memory elements 110. Processor 105 can execute the program code accessed from memory elements 110 via system bus 115. In one aspect, for example, system 100 can be implemented as a computer that is suitable for storing and/or executing program code. It should be appreciated, however, that system 100 can be implemented in the form of any system comprising a processor and memory that is capable of performing the functions described within this specification.

Memory elements 110 can include one or more physical memory devices such as, for example, local memory 120 and one or more bulk storage devices 125. Local memory 120 refers to random access memory (RAM) or other non-persistent memory device(s) generally used during actual execution of the program code. Bulk storage device(s) 125 can be implemented as a hard drive or other persistent data storage device. System 100 also can include one or more cache memories (not shown) that provide temporary storage of at least some program code in order to reduce the number of times program code must be retrieved from bulk storage device 125 during execution.

Input/output (I/O) devices such as a keyboard 130, a display 135, and a pointing device (not shown) optionally can be coupled to system 100. The I/O devices can be coupled to system 100 either directly or through intervening I/O controllers. Network adapters also can be coupled to system 100 to enable system 100 to become coupled to other systems, computer systems, remote printers, and/or remote storage devices through intervening private or public networks. Modems, cable modems, and Ethernet cards are examples of different types of network adapters that can be used with system 100.

As pictured in FIG. 1, memory elements 110 can store a netlister module 145, a partition module 150, a global placer module 155, a superimposition model module 160, and a detailed placer module 170. Netlister module 145, partition module 150, global placer module 155, superimposition model module 160, and detailed placer module 170, being implemented in the form of executable program code, can be executed by system 100.

Netlister module 145 can receive a circuit design 140 specified in programmatic form using, for example, a hardware description language (HDL). Netlister module 145 can synthesize a netlist of components for circuit design 140 that implements the functionality and/or architecture specified by circuit design 140. In general, synthesis refers to the process of converting, e.g., compiling, a circuit design specified in an HDL to a gate level description of the circuit design. Netlister module 145 can output a netlist of components. Netlister module 145 further can technology map components of the netlist to hardware units available within an IC, e.g., a programmable IC, that can, or are capable of, implementing each component of the netlist. Thus, each component of the netlist can be assigned to, or correlated with, a particular type of hardware unit available on the multi-die IC within which circuit design 140 is to be implemented. The resulting netlist of circuit design 140 can be provided to partition module 150 for further processing.

As used within this specification, the phrase "hardware unit," can refer to a circuit or group of circuits within an IC, e.g., a primitive within a programmable IC such as a multiplier, lookup table, or the like, that functions as a unit. As such, a hardware unit, though formed of one or more circuits, can be considered a single unit for purposes of placement of components of a netlist. In some cases, however, a single hardware unit can implement more than one component from a netlist.

Partition module 150 can receive the netlist of components from netlister module 145. Partition module 150 can implement any of a variety of partitioning techniques that partition, or subdivide, the components of the netlist among the plurality of dies used to implement the multi-die IC. As used within this specification, a "die" can refer to a separate and distinct segment of semiconductor material used to implement a multi-die IC or a section of a multi-die IC. Partitioning module 150 can determine a number of inter-die signals that couple components partitioned to different dies of the multi-die IC that result from partitioning the components of the netlist. For each die pair, in reference to a pair of dies coupled by an inter-die signal, partitioning module 150 can determine whether the number of inter-die signals generated for the die pair exceeds a number of inter-die wires, i.e., physical wires that couple the die pair, within the multi-die IC.

As used within this specification, the term "inter-die wire" can refer to any of a variety of conductive materials that can electrically couple a pair of physically distinct dies in a manner that allows the pair of physically distinct dies to communicate an inter-die signal. For example, an inter-die wire can be implemented with bondwires, interconnect material within a matrix material used to package the plurality of dies, interconnect material within an IC substrate upon which the plurality of dies are bonded, or the like. Partition module 150 can output partitioning data specifying an assignment of components of the netlist of circuit design 140 to dies of the multi-die IC to global placer module 155.

In one embodiment, partition module 150 can be implemented as a min-cut partitioner. When partition module 150 is implemented as a min-cut partitioner, partition module 150 attempts to partition the components of the netlist among the plurality of dies in a manner that results in a minimum number of inter-die signals. It should be noted that a variety of techniques exist to implement min-cut partitioning and, as such, the min-cut partitioning techniques described are for purposes of illustration and are not intended to limit the embodiments disclosed within this specification. A more detailed description of min-cut partitioning follows in the discussion of FIG. 2 within this specification.

Global placer module 155 can receive partitioning data from partition module 150. Global placer module 155 can assign each component of the netlist to a location on the particular die to which that component is partitioned. Although global placer module 155 spatially places each component of the netlist of circuit design 140 at a particular coordinate location within the die to which the component is partitioned as specified, for example, by an (x, y) coordinate pair, global placer module 155 does not assign a particular hardware unit within the die to implement the component. For example, the exact location to which a component is assigned during global placement, e.g., the global placement location, may not coincide with a location of a hardware unit available upon the die that can implement the component. Global placer module 155 can output global placement data specifying a location of each component on the die to which that component is partitioned to detailed placer module 170.

Superimposition model module 160 can receive die location data 165. Die location data 165 can specify the physical location of each of the plurality of dies of the multi-die IC relative to one another. Die location data 165 further can specify a standard wire-length of each inter-die wire available for implementing inter-die signals between die pairs. In one embodiment, die location data 165 can specify a relative location of each of a plurality of dies that resides within, or is mounted upon, a common horizontal plane.

Using die location data 165, superimposition model module 160 can determine a wire-length and a coupling point for each inter-die wire available to implement an inter-die signal of circuit design 140 between a die pair of the multi-die IC. Superimposition model module 160 can generate a superimposition model of the multi-die IC by shifting the relative location of at least one die of each die pair coupled by an inter-die wire. The dies of a die pair can be shifted in terms of relative positioning by approximately the wire-length of the inter-die wire that couples the die pair. Superimposition model module 165 can output the superimposition model to detailed placer module 170.

Detailed placer module 170 can receive the superimposition model from superimposition model module 160. Detailed placer module 170 can receive global placement data for circuit design 140 from global placer module 155. Using the superimposition model and the global placement data, detailed placer module 170 can assign each component of the netlist of circuit design 140 to a hardware unit within a selected die. For example, the component can be given a coordinate location on the die that is the same as the hardware unit to which the component is assigned.

Detailed placer module 170 can determine a wire-length metric for signal paths, e.g., nets, of circuit design 140 according to signal path distance between the components forming each net. In one embodiment, detailed placer module 170 can calculate the wire-length metric using half perimeter wire-length (HPWL) for each signal path routed between hardware units within each of the plurality of dies. As used within this specification, the phrase "half perimeter wire-length," or "HPWL," refers to a distance between a start point and an end point of a signal path between two hardware units that is measured by summing the absolute differences in the x-coordinates and the y-coordinates of the start point and the end point of the signal path. HPWL is also referred to as the "Manhattan" distance between two points.

Detailed placer module 170 can calculate a wire-length metric for the plurality of dies by summing the HPWL of each signal path routed between hardware units. Detailed placer module 170 can iteratively assign, or re-assign as the case may be, components of the netlist of circuit design 140 to hardware units until the wire-length metric is minimized. Detailed placer module 170 can output data describing the location of each component of the netlist of circuit design 140 as component placement data 175.

In operation, netlister module 145 can receive circuit design 140. Circuit design 140 can be received as a complete circuit description input to system 100 via an input device of system 100 or a network connection to system 100, and stored within bulk storage device 125. Alternatively, circuit design 140 can be created and output from an application executing within system 100 to bulk storage device 125. Netlister module 145 can create a netlist of components for circuit design 140 that is output to partition module 150.

Since circuit design 140 is to be implemented within a multi-die IC, partition module 150 can partition the components of the netlist among the plurality of dies. As a result of partitioning the components of the netlist among the plurality of dies of the multi-die IC, partition module 150 can generate one or more inter-die signals that allow data to be exchanged among the plurality of dies. Each inter-die signal that communicatively links two dies of a die pair created by the partitioning of components can be transmitted and/or received via an inter-die wire that couples the die pair.

Subsequent to partitioning, partitioning module 150 can check whether the number of inter-die signals generated by the partitioning for each die pair is less than or equal to a number of inter-die wires available to couple the die pair within the multi-die IC. Partition module 150 can output partitioning data, e.g., a partitioned version of the netlist of circuit design 140, to global placer module 155. Using the partitioning data, global placer module 155 can determine a global placement location for components partitioned to each die. Global placer module 155 can output global placement data, e.g., a globally placed version of the netlist of circuit design 140, specifying a coordinate location for each component to detailed placer module 170.

Superimposition model module 160 can receive die location data 165. Using die location data 165, superimposition model module 160 can determine a location of each die used to implement circuit design 140 relative to each other die used to implement circuit design 140. Using the location of each of the plurality of dies, the wire-length of each inter-die wire, and the location of the coupling point for each inter-die wire, superimposition model module 160 can generate a superimposition model for the location of each die relative to each other die of the multi-die IC. The superimposition model generated by superimposition model module 160 can more accurately reflect half perimeter wire-lengths of each signal path routed between hardware units that reside in separate dies, and thus, are coupled by an inter-die signal assigned to an inter-die wire.

Detailed placer module 170 can receive global placement data from global placer module 155 and the superimposition model generated by superimposition model module 160. Using the superimposition model and the global placement data, for each die used to implement circuit design 140, detailed placer module 170 can assure at least one hardware unit is available to implement each component partitioned to the die. When no hardware unit is available to implement the component within the die to which the component is partitioned, detailed placer module 170 can search adjacent dies for an available hardware unit to which the component can be assigned.

In one embodiment, detailed placer module 170 can assign components to available hardware units nearest to the global placement location of each respective component as specified by the geographic coordinate of the component. It should be appreciated, however, that detailed placer module 170 can iteratively assign components to hardware units until the wire-length metric calculated for circuit design 140 using the superimposition model is minimized. The wire-length metric can be calculated by summing the HPWL for each signal path within, and between, each die of the multi-die IC used implement circuit design 140. The superimposition model generated by superimposition model module 160 offsets the relative location of one or both dies of each die pair by approximately the wire-length of the inter-die wires coupling the die pair. Using the superimposition model, the detailed placer module 170 can more accurately determine HPWL, and thus, more accurately assign components to hardware units of each die, particularly with respect to components coupled by inter-die signals.

Figure 2:
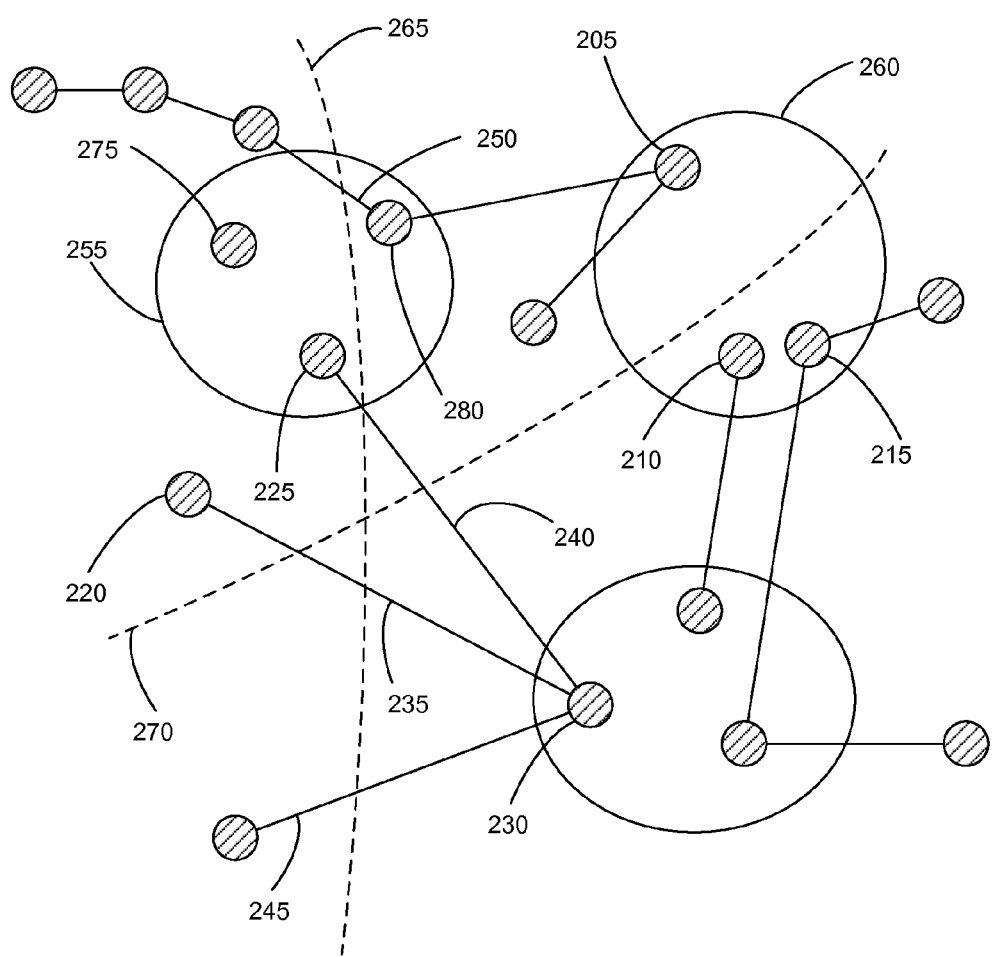
FIG. 2 is a hyper-graph illustrating a netlist to be implemented within a multi-die IC.

FIG. 2 is a hyper-graph 200 illustrating a netlist to be implemented within a multi-die IC. Hyper-graph 200 illustrates an example of a partitioning technique that can be implemented by partitioning module 150 of FIG. 1. Hyper-graph 200 illustrates a min-cut partitioning technique for partitioning components of a netlist for a circuit design among a plurality of dies of a multi-die IC within which the circuit design is to be implemented. Any of a variety of known min-cut partitioning techniques can be used to partition components among dies of the multi-die IC. As such, FIG. 2 is provided for purposes of illustration only and is not intended to limit the embodiments disclosed within this specification.

Referring to FIG. 2, hyper-graph 200 graphically represents components of a netlist of a circuit design and the signals exchanged between those components. Components of the netlist can include electrical circuit devices and signal or power coupling points such as I/O pads, power supplies, grounds, and the like. Hyper-graph 200 illustrates components as nodes and shows components 205, 210, 215, 220, 225, 230, 275, and 280. Hyper-graph 200 illustrates signals as lines coupling the nodes or as ovals enclosing three or more components. Accordingly, hyper-graph 200 illustrates signal paths 235, 240, 245, 250, 255, and 260. Hyper-graph 200 further illustrates partition lines 265 and 270.

When represented as a line, e.g., signal paths 235-250, each signal path couples two components. For example, signal path 235 connects component 220 with component 230. When represented as an oval, e.g., signal paths 255 and 260, the signal path connects three or more components enclosed within the oval. For example, signal path 260 connects components 205-215. Signal directionality is not represented by hyper-graph 200. Each of signal paths 235, 240, 245, 250, 255, and 260 must be assigned to a particular wire or routing resource within the multi-die IC, whether the wire is located entirely within a single die or is an inter-die wire.

Hyper-graph 200 graphically illustrates the impact of a particular partitioning of components of the netlist among dies of a multi-die IC. Partition lines 265 and 270 illustrate two possible and alternate partitioning solutions for the netlist represented by hyper-graph 200. Each solution partitions components between two dies. For example, components of hyper-graph 200 are divided between the two sides of partition line 265. Components residing on the left side of partition line 265 can be partitioned to a first die. Components residing on the right side of partition line 265 can be partitioned to a second die.

Each signal path that crosses partition line 265 represents an inter-die signal that requires, e.g., must be assigned to, one or more inter-die wires to couple components located on different dies of the multi-die IC. It should be noted that as a partition line crosses an oval signal path, although the partition line crosses two lines to traverse the oval, traversing an oval still represents a single inter-die signal. For example, partition line 265 crosses signal path 255, which is represented by an oval, at two distinct points. Only a single inter-die signal, however, is required as components 225 and 275 are partitioned to the first die and component 280 is partitioned to the second die. Accordingly, only a single inter-die signal is required to connect components 220 and 275 to component 280. Referring to FIG. 2, partition line 265 cuts across signal paths 235-255, thereby generating five inter-die signals.

The alternative partitioning created by partition line 270 cuts across three signal paths, i.e., signal paths 235, 240, and 260. Partition line 270 represents a partitioning of hyper-graph 200 that generates three inter-die signals. Iteratively repeating this process, a partitioning of the circuit design representing hyper-graph 200 can be determined that generates a minimum number of inter-die signals, and thus, requires a minimum number of inter-die wires.

Figure 3:
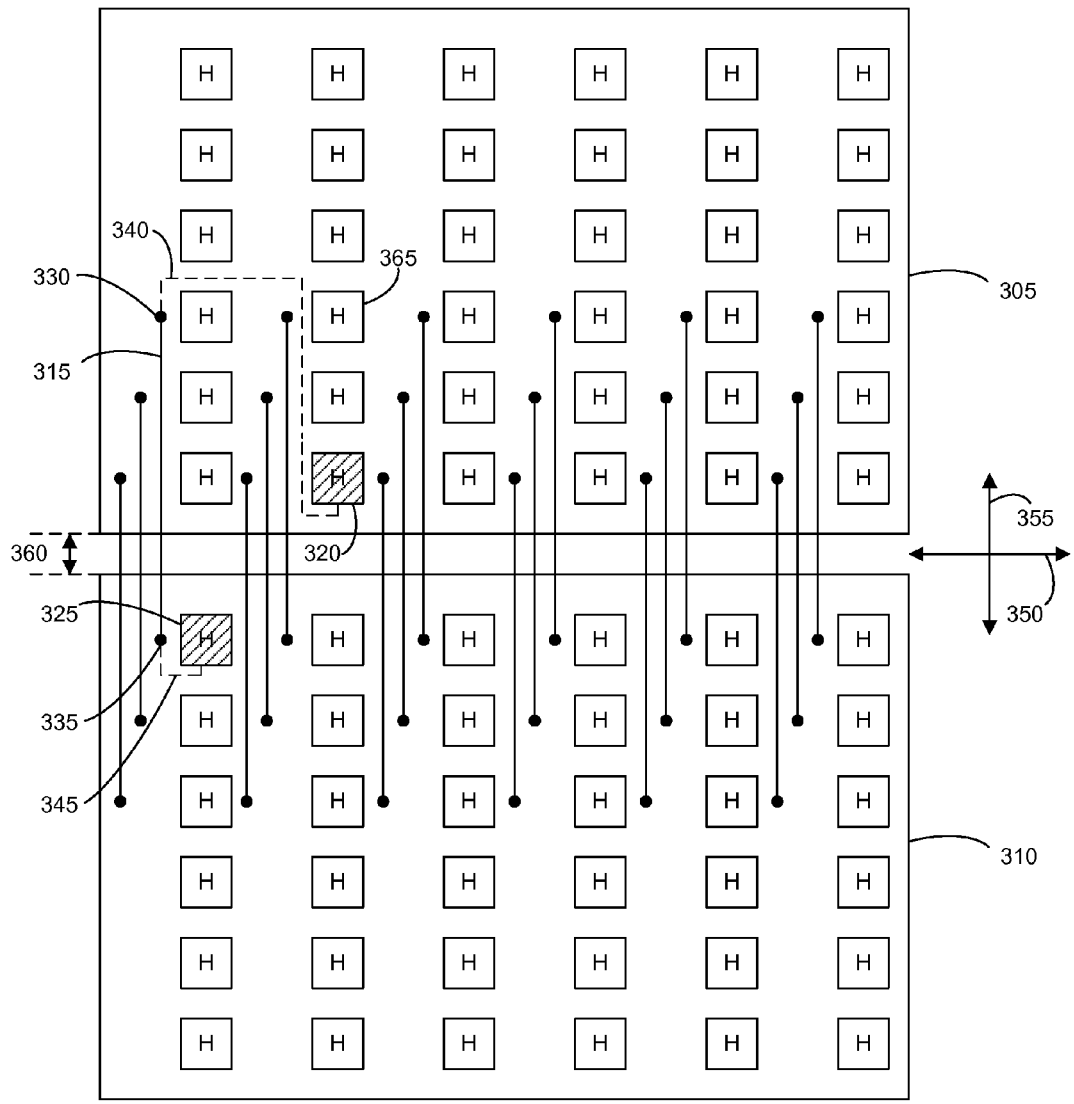
FIG. 3 is a second block diagram illustrating a topographic view of a multi-die IC.

FIG. 3 is a second block diagram illustrating a topographic view of a multi-die IC 300. Multi-die IC 300 illustrates one embodiment of an IC implementing a circuit design with a plurality of dies. As shown, multi-die IC 300 can include dies 305 and 310. It will be appreciated that the techniques shown and described herein can also be extended to more than two dies. For example, other dies (not shown), also can be optionally included in multi-die IC 300.

The components of a netlist of a circuit design implemented within multi-die IC 300 can be partitioned among dies 305 and 310. Each of dies 305 and 310 contains rows and columns of hardware units, such as hardware units 320 and 325, that can be used to implement the components of the circuit design. Although illustrated with six rows and six columns in FIG. 3, dies 305 and 310 can be implemented with any of a variety row and/or column configurations. As such, the implementation of dies 305 and 310 pictured in FIG. 3 is provided for purposes of illustration and is not intended to limit the embodiments disclosed within this specification.

Dies 305 and 310 can be horizontally stacked, and reside, within a single IC package and/or upon a common IC substrate. In that case, each of dies 305 and 310 can be horizontally aligned on a common horizontal plane separated by an inter-die space 360 as shown. The common horizontal plane can be defined by x-axis 350 and y-axis 355. Inter-die wires, such as inter-die wire 315, can couple die 305 to die 310. Multi-die IC 300 can include a predetermined number of inter-die wires that can be used to couple die 305 to die 310. Fewer or more inter-die wires can be used. The particular configuration of inter-die wires shown in FIG. 3 is presented for purposes of illustration only and, as such, is not intended to limit the embodiments disclosed within this specification.

As pictured, each inter-die wire can have a same predetermined wire-length. Each of dies 305 and 310 resides in a common horizontal plane with each coupling point of each inter-die wire coupling die 305 to die 310 sharing a common x-coordinate along x-axis 350. For example, inter-die wire 315 is coupled to die 305 at coupling point 330 and coupled to die 310 at coupling point 335. Coupling points 330 and 335 share a common x-coordinate along x-axis 350.

Typically, a conventional place and route system determines a detailed placement of components of a circuit design within an IC according to a shortest Manhattan distance between hardware units implementing the components. The same approach can be used for performing detailed placement of a circuit design for a multi-die IC when placing components sharing a common signal, but residing on different dies. For example, a first component and a second component of a netlist for a circuit design can share a common signal. The first component can be partitioned to die 305. The second component can be partitioned to die 310. Partitioned in this manner, the common signal becomes an inter-die signal that must utilize an inter-die wire.

The conventional place and route system typically uses a two dimensional model that is effective when placing and routing components within a single die IC. For example, the conventional place and route system selects hardware unit 320 to implement the first component within die 305. Using the typical two dimensional model for the location of die 305 relative to die 310, the conventional place and route system selects, for example, hardware unit 325 to implement the second component. In this example, hardware unit 325 is the nearest available hardware unit to hardware unit 320 that is capable of implementing the second component. When the first and second components are placed in this manner, however, wires are not available to route a signal path directly from hardware unit 320 to hardware unit 325 as each resides on a different die. The first and second components are placed using the presumption that HWPL accurately reflects, or is a reasonable estimate of, actual length of the signal path. Considering the configuration of multi-die 300, however, placing the first component that is partitioned to die 305 to hardware unit 365, as opposed to hardware unit 320, results in a shorter wire-length metric, e.g., a smaller HWPL between the net formed by the two hardware units.

Placed in this manner, an inter-die signal common to dies 305 and 310 is generated that must be assigned to an inter-die wire such as inter-die wire 315. Thus, to couple hardware unit 320 to hardware unit 325, interconnect 340 must be routed within die 305 from hardware unit 320 to coupling point 330. For the same reason, interconnect 345 must be routed within die 310 from hardware unit 325 to coupling point 335. The signal path between hardware unit 330 and hardware unit 335 traverses interconnect 340, inter-die wire 315, and interconnect 345. As a result, the HWPL calculation, or estimation, for the intra-die interconnect necessary to couple hardware unit 320 is no longer accurate. The actual length of the signal path, not including the length of inter-die wire 315, is five units, which is determined by summing one unit of length for interconnect 345 and four units of length for interconnect 340.

Accordingly, conventional place and route systems can place a disproportionate number of components along the adjacent edges of dies 305 and 310. This occurs because the conventional place and route systems inaccurately predict the length of the actual signal path formed of the interconnects and inter-die wire necessary to couple hardware units located within different dies. Accordingly, a detailed placement of components within a multi-die IC performed by the conventional place and route system likely will not minimize interconnect routing within the multi-die IC.

Within FIG. 3, dies 305 and 310 of multi-die IC 300 are illustrated within a common horizontal plane with coupling points 325 and 330 having a same x-coordinate along x-axis 350. Although illustrated in this manner in FIG. 3 for descriptive purposes, the relative location of any plurality of dies used to implement a multi-die IC can vary according to the design and packaging requirements for the multi-die IC. For example, in some embodiments the two dies 305 and 310 can be offset from each other in two dimensions (x and y), and not in just one dimension (y) as shown in FIG. 3. As such, the arrangement of multi-die IC 300 illustrated in FIG. 3 is provided for purposes of illustration and is not intended to limit the embodiments disclosed within this specification.

Figure 4:
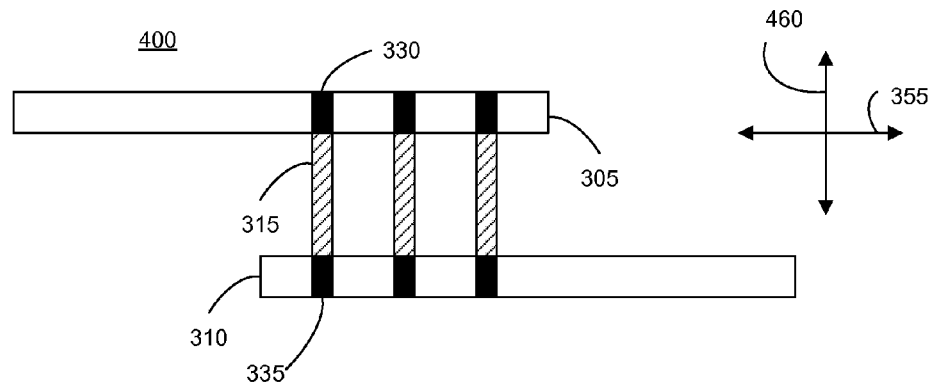
FIG. 4 is a third block diagram illustrating a side view of a superimposition model of a multi-die IC.

FIG. 4 is a third block diagram illustrating a side view of a superimposition model 400 of a multi-die IC. FIG. 4 illustrates a side view of superimposition model 400 generated for multi-die IC 300 of FIG. 3. As such, like numbers will be used to refer to the same items throughout this specification. The superimposition model 400 is illustrated in three dimensions with x-axis 350 running directly into the page, e.g., perpendicular to each of y-axis 355 and z-axis 460. Superimposition model 400 shifts the relative location of die 305 and/or die 310 of multi-die IC 300 in a manner that more accurately reflects interconnect routing requirements and coupling point locations for inter-die wires when hardware units that reside on different dies are linked by an inter-die signal.

Referring to FIG. 4, the location of each of at least one of dies 305 and/or 310 has been shifted along y-axis 355 relative to the locations shown in FIG. 3. Die 305 and/or die 310 have been shifted so that coupling points 330 and 335 are aligned and have a same x-coordinate on x-axis 350 and a same, e.g., common, y-coordinate on y-axis 355. As such, the relative locations of dies 305 and 310 are shifted by the wire-length of inter-die wire 315 coupling dies 305 and 310. The wire-length of an inter-die wire can be measured as the distance between two coupling points, e.g., two end points, of the inter-die wire.

Shifting the position of dies 305 and 310 as shown effectively overlaps die 305 onto die 310 within superimposition model 400 by the wire-length of inter-die wire 315. It should be noted that the location of each of dies 305 and 310 along x-axis 350 remains constant within superimposition model 400 relative to FIG. 3. Arranged in this manner, coupling points 330 and 335 have a same x-coordinate on x-axis 350 and a same y-coordinate on y-axis 355.

Shifting the position of dies 305 and 310 as shown results in coupling points 330 and 335 being vertically stacked along z-axis 460. Inter-die wire 315 has zero wire-length along y-axis 355, but is shown to have a length along z-axis 460. Although illustrated with dies 305 and 310 being vertically shifted along z-axis 460 in FIG. 4 for clarity and descriptive purposes, dies 305 and 310 can be superimposed to share a same z-coordinate along z-axis 460. Alternatively, the z-component when calculating wire-length can be ignored. Thus, inter-die wire 315 can be considered to have no wire-length.

Using superimposition model 400, a place and route system can determine a detailed placement for components and, more particularly, for components sharing a common signal but that reside on two separate dies. Superimposition model 400 better reflects the relative distance between, and routing requirements for, hardware units used to implement components of a circuit design that are partitioned to different dies and that must be, at least in part, coupled with an inter-die wire.

Figure 5:
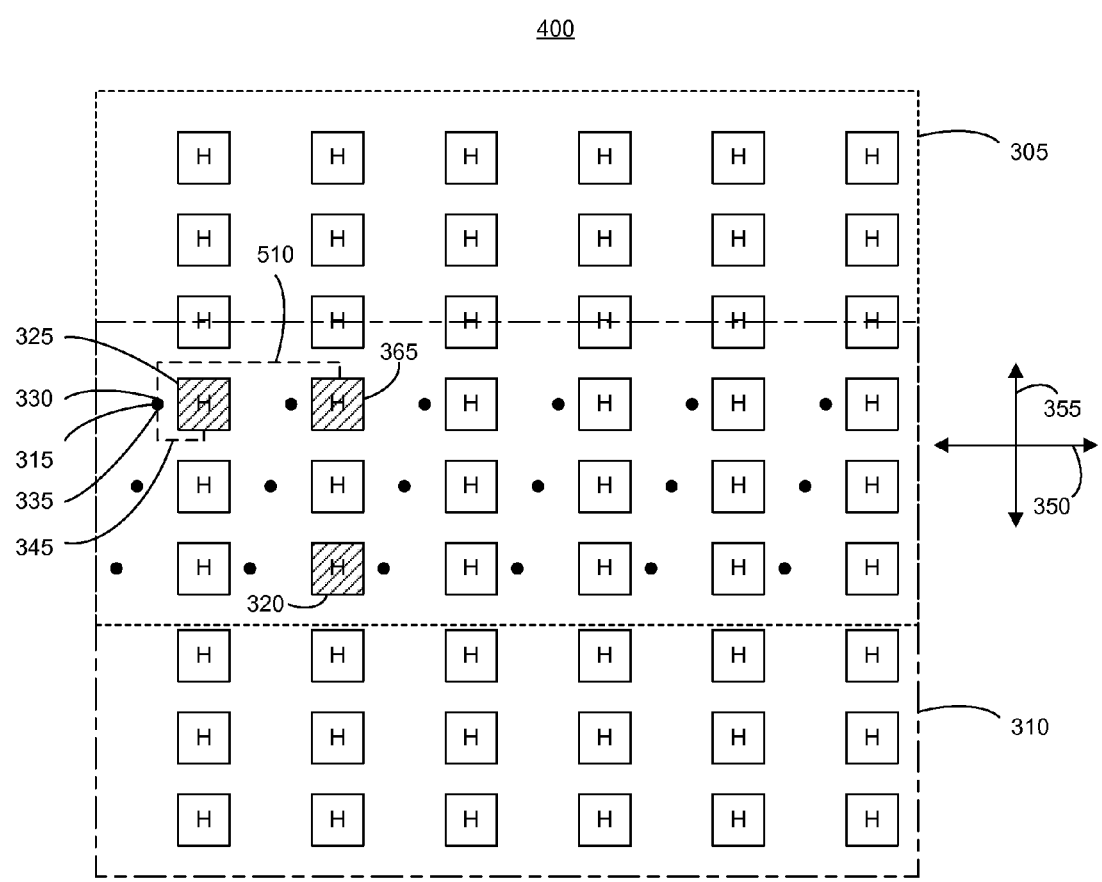
FIG. 5 is a fourth block diagram illustrating a topographic view of a superimposition model of a multi-die IC.

FIG. 5 is a fourth block diagram illustrating a topographic view of superimposition model 400 of a multi-die IC. FIG. 5 illustrates a topographic view of superimposition model 400 generated for multi-die IC 300 of FIG. 3. Within FIG. 5, superimposition model 400 shifts the relative locations of dies 305 and 310 of multi-die IC 300 by the wire-length of the inter-die wires used to couple die 305 to die 310. Viewed topographically, dies 305 and 310 overlap by the wire-length of inter-die wire 315.

As superimposition model 400 has shifted the positioning of dies 305 and 310 to superimpose the coupling points of each inter-die wire for dies 305 and 310 over a same x-coordinate and y-coordinate, each inter-die wire and the coupling points associated with each inter-die wire appear as a single point within FIG. 5. For example, coupling points 330 and 335 and inter-die wire 315, being superimposed in superimposition model 400, appear as a single point in FIG. 5. With dies 305 and 310 positioned in this manner, superimposition model 400 eliminates inter-dies wires from the calculation of HPWL of interconnect routing coupling hardware units residing within separate dies.

Using superimposition model 400 to evaluate the signal path discussed within FIG. 3, selecting hardware site 365 in die 305 in lieu of hardware site 320 results in a shorter wire length metric when implementing an inter-die signal to hardware site 320 in die 310. Using superimposition model 400, the system can determine that hardware unit 365 of die 305 is the nearest available hardware unit to implement the component partitioned to die 305 that shares an inter-die signal with a component that is implemented within die 310 in hardware unit 320. The calculated distance metric, e.g., using HWPL, for the interconnect necessary to couple hardware unit 325 to hardware unit 365 (now excluding the wire-length of inter-die wire 315) is three units. The three unit wire-length is calculated by summing one unit of wire-length for interconnect 345 coupling hardware unit 325 to coupling point 335 in die 310 and two units of wire-length for interconnect 510 coupling hardware unit 505 to coupling point 330 in die 305. By comparison, the calculated wire-length for the interconnects necessary to couple hardware unit 325 to hardware unit 320 using the conventional place and route model illustrated in FIG. 3 is five units.

Thus, use of the superimposition model facilitates selection of the placement solution illustrated in FIG. 5 by the system due to the shorter wire-length compared to the placement solution illustrated in FIG. 3. Using superimposition model 400 in place of the conventional 2-D positioning of dies 305 and 310 shown in FIG. 3, a place and route system can more accurately determine which available hardware units within dies 305 and 310 should be assigned to components located on different dies and coupled by an inter-die signal.

Figure 6:
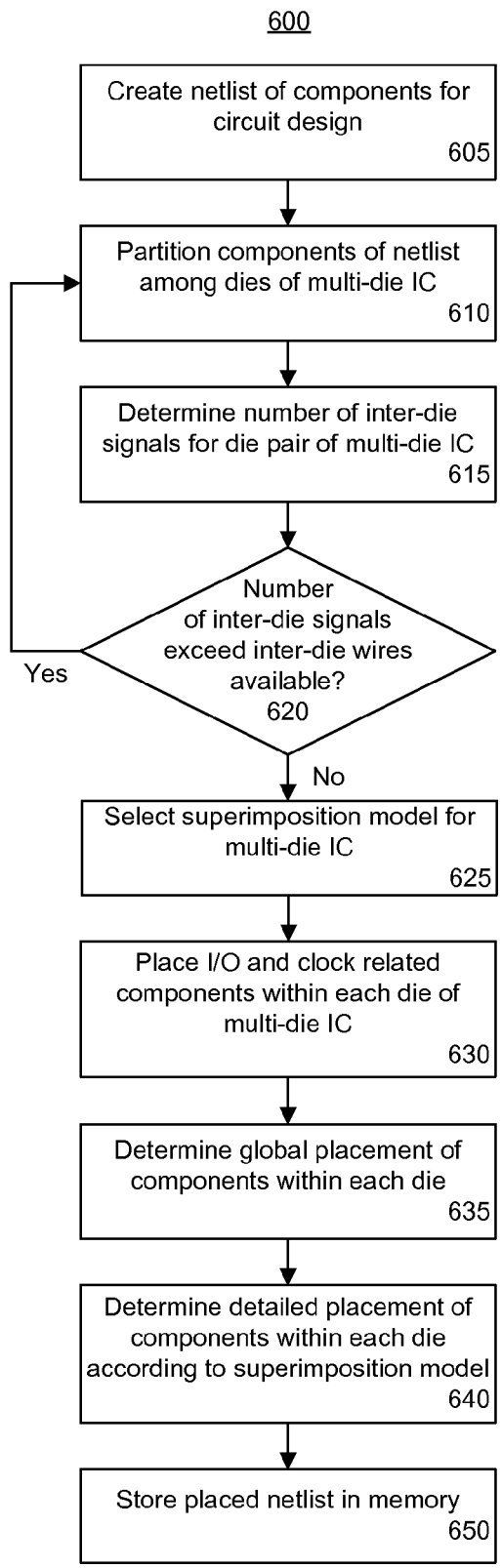
FIG. 6 is a first flow chart illustrating a method of component placement for use with a multi-die IC.

FIG. 6 is a first flow chart illustrating a method 600 of component placement for use with a multi-die IC. Method 600 can be implemented using a system as described with reference to FIGS. 1, 2, 4, and 5, for example. In general, method 600 describes a method of component placement for implementing a circuit design within a multi-die IC that minimizes intra-die interconnect routing, particularly as applied to placing components located in different dies, but coupled via an inter-die signal or wire. It should be appreciated that for purposes of illustration, method 600 is described with reference to a multi-die IC that includes two dies, e.g., a single die pair. The techniques illustrated, however, can be applied to multi-die ICs that include more than two dies. For example, a multi-die IC having three dies can include two die pairs, etc.

Beginning in step 605, the system can create a netlist of components for a circuit design to be implemented with a multi-die IC. The netlist can describe the components of the circuit design as well as the signal paths coupling the components of the circuit design. In step 610, the system can determine a partitioning of the components of the netlist among a plurality of dies of the multi-die IC. In one embodiment, the components of the netlist can be partitioned in a manner that generates a minimum number of inter-die signals. The system can iteratively partition the components of the netlist among the die pair of the multi-die IC until a partitioning solution is determined that has a minimum number of inter-die signals.

In step 615, the system can determine the number of inter-die signals for the die pair of the multi-die IC. The number of inter-die signals for the die pair is specified by the partitioning solution that is selected. In decision box 620, the system can determine whether the number of inter-die signals determined in step 610 for the die pair exceeds the number of inter-die wires available. When the number of inter-die signals determined for the die pair exceeds the number of inter-die wires available, method 600 can return to step 610. The system can, for example, generate and/or select a partitioning solution that does not have a minimum number of inter-die signals, but that meets the criteria established in decision block 620 in terms of the number of inter-die wires required for implementation. When the number of inter-die signals determined for the die pair does not exceed the number of available inter-die wires, method 600 can proceed to step 625.

In step 625, the system can select a superimposition model for the multi-die IC. For example, one or more superimposition models can be stored, where each superimposition model represents a particular multi-die IC. A superimposition model can be selected for the particular multi-die IC within which the circuit design is to be implemented. In another embodiment, the superimposition model can be generated. In either case, as noted, the superimposition model effectively shifts the relative location of one or both dies of the die pair as described within this specification. In step 630, the system can place I/O and clock related components within each die of the multi-die IC.

In step 635, the system can determine a global placement for each component of the netlist within the die to which the component is partitioned. The system can determine a global placement location for each component by assigning each component a geographic coordinate within the die to which the component has been partitioned. A hardware unit may or may not be located at the particular location enumerated by the geographical coordinate of a component. The distribution, e.g., assignment, of components of the circuit design to global placement locations within each die can be performed using any of a variety of techniques. For example, components can be distributed using a random and/or uniform distribution technique to spread components across each die, using one or more metrics including, but not limited to, connectivity, signal delay or timing (wire-length), preliminary routing concerns, etc., or any combination thereof. In terms of wire-length, for example, the superimposition model can be used when determining global placement locations for components that are coupled to other components partitioned to a different die.

In step 640, the system can determine a detailed placement location for each component within each die. The detailed placement location of each component can be determined, at least in part, according to the superimposition model. The detailed placement location is, in general, a revised coordinate location that coincides with a coordinate location of a nearby hardware unit that is available, e.g., not used, and that can implement the subject component of the circuit design. For example, components assigned to locations that do not coincide with a hardware unit capable of implementing that component can be moved or assigned to a location corresponding to a nearest available hardware unit that is capable of implementing that component. The distance determination can be performed using the superimposition model. Further, the detailed placement location that is determined can be in the same die to which the component was initially partitioned or to a different die when no hardware units are available within the die to which the component was originally partitioned.

By selecting placement locations, e.g., global placement location, detailed placement location, both, or only detailed placement location, by calculation of wire-lengths according to the superimposition model, the overall wire-length metric for the circuit design can be minimized. It should be appreciated, however, that one or more optimization techniques can be used where subsequent to detailed placement or as part of detailed placement, components are selectively moved to different hardware sites and/or swapped to different locations in an attempt to further decrease the wire-length metric. The embodiments disclosed herein optionally can include such processing steps.

In step 650, the system can store the store the placed netlist, e.g., the netlist in addition or combination with detailed placement information, within memory of the system. The circuit design subsequently can be instantiated within a multi-die IC.

Figure 7:
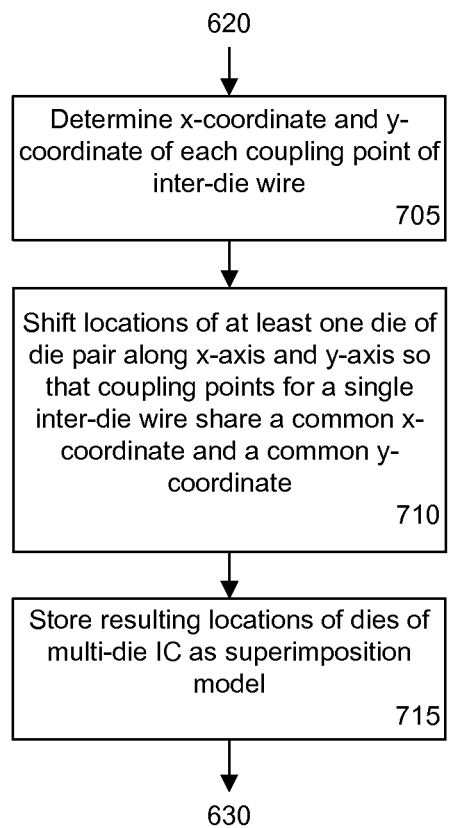
FIG. 7 is a second flow chart illustrating a method of generating a superimposition model for a multi-die IC.

FIG. 7 is a second flow chart illustrating a method of generating a superimposition model for a multi-die IC. The method of FIG. 7 illustrates an exemplary method of implementing step 625 of FIG. 6 when a model is to be generated. As noted with reference to FIG. 6, while FIG. 7 is described in terms of a single die pair, it should be appreciated that the technique described with reference to FIG. 7 can be performed for a multi-die IC that includes a plurality of die pairs.

In step 705, the system can determine an x-coordinate along an x-axis and a y-coordinate along a y-axis for each of two coupling points of an inter-die wire. FIG. 7 illustrates the example in which each die of the die pair is disposed on a same horizontal plane defined by the x-axis and the y-axis as illustrated with reference to FIG. 3. Thus, the coupling points of the inter-die wire have one common coordinate which is, in this example, a common x-coordinate.

In step 710, the system can shift one or both dies of the multi-die IC along at least one axis, e.g., in this case the y-axis, so that the two coupling points share both a common x-coordinate and a common y-coordinate. The data indicating positioning of the dies of the die pair and the location of each hardware unit within each die relative to the new superimposed position of each die as illustrated in FIGS. 4 and 5 specifies the superimposition model. As noted, the z-coordinate of each die can be largely ignored or presumed to be the same despite the three dimensional example shown in FIG. 4.

In step 715, the system can store the superimposition model of the multi-die IC within memory. The method of FIG. 7 then can continue to step 630 of FIG. 6.

Figure 8:
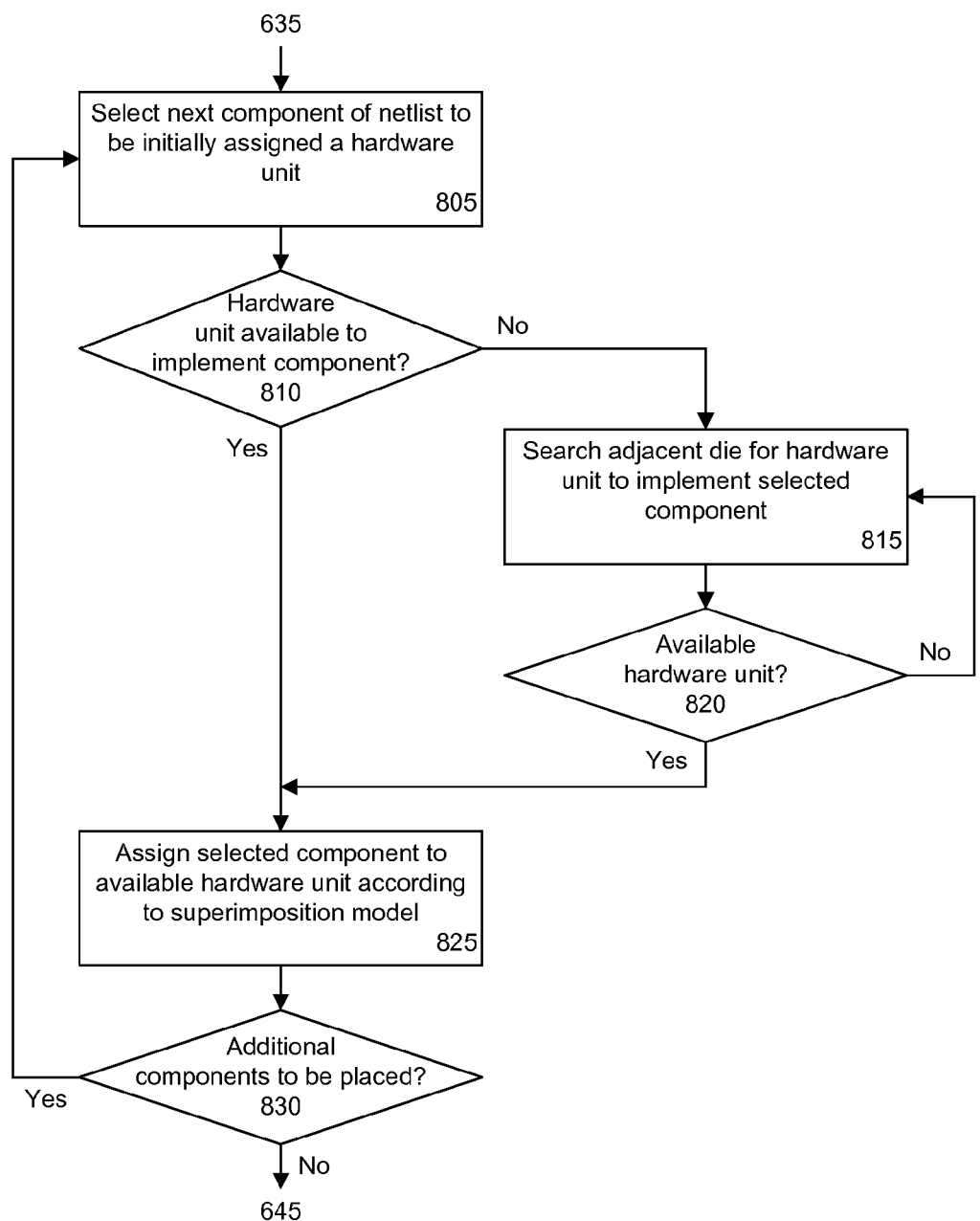
FIG. 8 is a third flow chart illustrating a method of placing components of a circuit design for use with a multi-die IC.

FIG. 8 is a third flow chart illustrating a method 800 of placing components of a circuit design for use with a multi-die IC. FIG. 8 illustrates one example of an exemplary method of performing step 640 of FIG. 6.

Beginning in step 805, the system can select a component from the netlist of the circuit design for determination of a detailed placement location. At least initially, the system can attempt to place the selected component to an available hardware site capable of implementing that component within the same die to which the component was originally partitioned.

In decision box 810, the system can determine whether a hardware unit is available to implement the component within the die to which the component is partitioned. Although a geographic coordinate is assigned to each component during global placement, sufficient hardware units may not be available within the die to implement the selected component. When a hardware unit is available to implement the component within the die to which the component was originally partitioned, the method can proceed to step 830. When a hardware unit is not available to implement the component within the die to which the component was originally partitioned, the method can proceed to step 815.

In step 815, the system can search a next adjacent die for an available hardware unit that can implement the selected component. In decision box 820, the system can determine whether a hardware unit is available within the next adjacent die. When a hardware unit is available within the next adjacent die, the method can continue to step 825. When a hardware unit is not available within the next adjacent die, the method can return to step 815 and search a next adjacent die for an available hardware unit that can implement the selected component. Though not illustrated, error handling can be included to address cases in which hardware units are not available. Further, availability of inter-die wires for each resulting inter-die signal can be check by iterating one or more steps described with reference to FIG. 6.

In step 825, the system can assign the selected component to an available hardware unit determined through step 810, or steps 815 and 820. When more than one hardware unit is available to implement the selected component, the particular hardware unit to which the component is assigned can be determined using the superimposition model. More particularly, the system can select the hardware unit that results in the smallest wire-length for the resulting signal path as calculated using the superimposition model. In one embodiment, the detailed placement location for the component can be the available hardware unit that is closest to the global placement location of the selected component as determined using superimposition model for computing wire-length. The detailed placement location also can be an available hardware unit resulting in a lowest wire-length metric irrespective of the distance from the global placement location, whether the wire-length metric is for the particular signal involved in the current placement operation or one or more or all dies collectively.

In decision box 830, the system can determine whether additional component of the netlist are to be placed. When additional components of the netlist require detailed placement, the method can return to step 805 to select a next component and continue processing. When no further components of the netlist require detailed placement, the method can return to step 645 of FIG. 6.

The embodiments disclosed within this specification provide techniques for placement of components for use with a multi-die IC. The embodiments provide a more accurate means of determining or estimating wire-length between hardware units and particularly hardware units that are coupled by inter-die signal and/or wires.

The flowcharts in the figures illustrate the architecture, functionality, and operation of possible implementations of systems, methods and computer program products according to various embodiments. In this regard, each block in the flowcharts may represent a module, segment, or portion of code, which comprises one or more portions of executable program code that implements the specified logical function(s).

It should be noted that, in some implementations, the functions noted in the blocks shown in FIGS. 6-8 may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Embodiments of the present invention can be realized in hardware or a combination of hardware and software. The embodiments can be realized in a centralized fashion in one system or in a distributed fashion where different elements are spread across several interconnected systems. Any kind of data processing system or other apparatus adapted for carrying out the methods described herein is suited.

Embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to perform the functions described herein. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. A method of component placement for a multi-die integrated circuit (IC), the method comprising:
    partitioning a plurality of components of a netlist among a plurality of co-planar dies of the multi-die IC;
    selecting a superimposition model specifying a positioning of at least two of the plurality of co-planar dies at least partially superimposed with respect to one another; and
    assigning, by a processor, components of the netlist to hardware units within each of the plurality of co-planar dies according, at least in part, to a wire-length metric calculated using the superimposition model.

2. The method of claim 1, wherein partitioning the plurality of components comprises:
    selecting a partitioning solution resulting in a minimum number of inter-die signals.

3. The method of claim 1, wherein partitioning the plurality of components comprises:
    for each pair of dies coupled by at least one inter-die signal, determining whether a number of inter-die signals between the pair of dies exceeds a number of inter-die wires coupling the pair of dies.

4. The method of claim 1, wherein partitioning the plurality of components comprises:
    when the number of inter-die signals for at least one pair of dies exceeds a number of inter-die wires coupling the pair of dies, selecting an alternate partitioning of the plurality of components.

5. The method of claim 1, wherein the superimposition model superimposes a first die of a pair of dies of the multi-die IC that are coupled by at least one inter-die wire to partially overlap a second die of the pair of dies.

6. The method of claim 5, wherein:
    the superimposition model repositions the pair of dies relative to one another with a connection point of the first die co-located with a connection point of the second die;
    the connection point of the first die couples to a first endpoint of the at least one inter-die wire; and
    the connection point of the second die couples to a second endpoint of the at least one inter-die wire.

7. The method of claim 1, wherein assigning components of the netlist to hardware units comprises:
    for each component of the netlist, determining whether at least one hardware unit is available within the die to which the component is partitioned; and
    when at least one hardware unit is not available within the die to which the component is partitioned, selecting a hardware unit to which the component is to be assigned within a different die according to the wire-length metric using the superimposition model.

8. The method of claim 1, wherein wires within the plurality of dies contribute to the wire-length metric and inter-die wires do not contribute to the wire-length metric.

9. The method of claim 1, wherein the positioning specified by the superimposition model positions the at least two of the plurality of dies to partially overlap.

10. A system that determines component placement for a multi-die integrated circuit (IC), the system comprising:
    a memory storing program code; and
    a processor coupled to the memory and executing the program code, wherein the processor, responsive to executing the program code, is configured to perform operations comprising:
    partitioning a plurality of components of a netlist among a plurality of co-planar dies of the multi-die IC;
    selecting a superimposition model specifying a positioning of at least two of the plurality of co-planar dies at least partially superimposed with respect to one another; and
    assigning, by the processor, components of the netlist to hardware units within each of the plurality of co-planar dies according, at least in part, to a wire-length metric calculated using the superimposition model.

11. The system of claim 10, wherein the processor is further configured to perform an operation comprising:
    selecting a partitioning solution resulting in a minimum number of inter-die signals.

12. The system of claim 10, wherein the processor is further configured to perform an operation comprising:
    for each pair of dies coupled by at least one inter-die signal, determining whether a number of inter-die signals between the pair of dies exceeds a number of inter-die wires coupling the pair of dies.

13. The system of claim 10, wherein the superimposition model superimposes a first die of a pair of dies of the multi-die IC that are coupled by at least one inter-die wire to partially overlap a second die of the pair of dies.

14. The system of claim 13, wherein:
the superimposition model repositions the pair of dies relative to one another with a connection point of the first die co-located with a connection point of the second die;
the connection point of the first die couples to a first endpoint of the at least one inter-die wire; and
the connection point of the second die couples to a second endpoint of the at least one inter-die wire.

15. The system of claim 14, wherein the superimposition model shifts at least one die of the pair of dies along at least one axis of a pair of axes defining the common plane.

16. A device, comprising:
a non-transitory data storage medium usable by a system comprising a processor and a memory, wherein the data storage medium stores program code that, when executed by the system, causes the system to execute operations comprising:
partitioning a plurality of components of a netlist among a plurality of co-planar dies of the multi-die IC;
selecting a superimposition model specifying a positioning of at least two of the plurality of co-planar dies at least partially superimposed with respect to one another; and
assigning components of the netlist to hardware units within each of the plurality of co-planar dies according, at least in part, to a wire-length metric calculated using the superimposition model.

17. The device of claim 16, wherein partitioning the plurality of components comprises:
selecting a partitioning solution resulting in a minimum number of inter-die signals.

18. The device of claim 16, wherein partitioning the plurality of components comprises:
for each pair of dies coupled by at least one inter-die signal, determining whether a number of inter-die signals between the pair of dies exceeds a number of inter-die wires coupling the pair of dies.

19. The device of claim 16, wherein the superimposition model superimposes a first die of a pair of dies of the multi-die IC that are coupled by at least one inter-die wire to partially overlap a second die of the pair of dies.

20. The device of claim 19, wherein:
the superimposition model repositions the pair of dies relative to one another with a connection point of the first die co-located with a connection point of the second die;
the connection point of the first die couples to a first endpoint of the at least one inter-die wire; and
the connection point of the second die couples to a second endpoint of the at least one inter-die wire.

* * * * *